United States Patent [19]
Heikkilä et al.

[11] Patent Number: 5,525,940
[45] Date of Patent: Jun. 11, 1996

[54] DEVICE AND METHOD FOR TUNING A COMBINER FILTER

[75] Inventors: Pekka Heikkilä; Eero Koukkari; Seppo Nousiainen; Juha Vasanoja; Martti Kainulainen; Jukka Kyllönen; Teuvo Haukipupo; Esa Niemitalo; Harri Tikka, all of Oulu, Finland

[73] Assignee: Nokia Telecommunications Oy, Espoo, Finland

[21] Appl. No.: 295,665

[22] PCT Filed: Dec. 29, 1993

[86] PCT No.: PCT/FI93/00567

§ 371 Date: Oct. 25, 1994

§ 102(e) Date: Oct. 25, 1994

[87] PCT Pub. No.: WO94/16497

PCT Pub. Date: Jul. 21, 1994

[30] Foreign Application Priority Data

Dec. 30, 1992 [FI] Finland ................................ 925956

[51] Int. Cl.⁶ ............................................ H03H 7/46
[52] U.S. Cl. ........................ 333/17.1; 333/104; 333/132; 455/125
[58] Field of Search ...................... 333/17.1, 132; 455/120, 123, 125

[56] References Cited

U.S. PATENT DOCUMENTS 3,715,690  2/1973  Young et al. ..................... 333/17.1
4,726,071  2/1988  Jachowski ........................ 455/125

FOREIGN PATENT DOCUMENTS 0494058  7/1992  European Pat. Off.
9220149  11/1992  WIPO.

*Primary Examiner*—Paul Gensler
*Attorney, Agent, or Firm*—Cushman Darby & Cushman

[57] ABSTRACT

A device for tuning a combiner filter. The measuring signals ($P_{rl} \ldots P_{rn}$, $P_{F1} \ldots P_{Fn}$) of a number of different combiner filters are multiplexed to the same detectors. Multiplexing allows the measuring and adjusting electronics required by the tuning and adjusting means of combiner filters to be simplified considerably especially with a high number of combiner filters. Multiplexing of measuring signals is used primarily to select the sample signals of the forward and reflected power of one and the same combiner filter to be tuned for the measuring electronics. In the invention selectors for reflected power and forward power are independent of each other, which allows isolation measurement between different channels. The sample signal of the forward power of one combiner filter and the sample signal of the reflected power of another combiner filter are thus connected to the measuring electronics. When both sample signals undergo frequency-selective detection at the same frequency, the degree of isolation between the radio channels will be determined.

7 Claims, 2 Drawing Sheets

DEVICE AND METHOD FOR TUNING A COMBINER FILTER

BACKGROUND OF THE INVENTION

The invention relates to a device for adjusting a combiner filter, comprising means for receiving a first sample signal proportional to forward RF power to the combiner filter and a second sample signal proportional to RF power reflected from the combiner filter; a first frequency-selective detector means for detecting the magnitude of the forward power by means of said first sample signal; a second frequency-selective detector means for detecting the magnitude of the reflected power by means of said second sample signal; a control means for adjusting the centre frequency of the combiner filter in response to the detection results of the detector means.

One known way to connect several radio transmitters to the same antenna or antenna line is to connect each radio transmitter through a separate bandpass filter having its centre frequency tuned to the transmitting frequency of the radio transmitter. Such bandpass filters are called combiner filters. The function of the combiner filter is to feed the transmitting signal of the respective radio transmitter to the antenna with the smallest possible losses and prevent the leakage of transmitting signals of different frequencies from other radio transmitters, from the direction of the antenna, to this particular radio transmitter as efficiently as possible. Conventionally, combiner bandpass filters are tuned fixedly to the transmitting frequencies of the radio transmitters. So it has not been possible to change the transmitting frequency of the radio transmitter without simultaneously changing the combiner filter or its tuning.

In certain cases, however, it is desirable that the frequencies of radio transmitters can be changed simply and rapidly. One such case is the base station of a cellular mobile radio system to which predetermined transmitting and receiving channels have been assigned. In cases where the channel allocation of the system can be altered, if desired, by varying the transmitting and receiving frequencies of the base stations, the channel capacity of the system can be utilized in a flexible and efficient way in varying conditions. Therefore combiner filters have been developed in which the centre frequency changes automatically with the transmitting frequency.

The adjustment of known automatically tunable combiner filters is based on measuring RF power reflected from the input of the filter or RF power passing through the combiner filter, and on locking to a minimum/maximum value of the measured power. A problem with this adjustment method is, however, the low adjusting accuracy and the narrow dynamic range. As the frequency selectivity of the entire adjusting system relies on the combiner filter, power components of other radio transmitters leaking through the combiner filter to its input cause the minimum reflection suppression value of the reflection suppression measurement at the filter input to be about 7 dB, which results in a narrow dynamic range for the measurement. In the adjustment method based on the measurement of the power passing through the combiner filter, the measuring dynamics of the maximum power value also remains low for the same reasons as above. In addition, the automatically tunable combiner filter based on this prior art adjustment method does not allow variation in the relative power levels between the radio transmitters, that is, the "mutual dynamics" is almost 0 dB, as a change in the power level of one transmitter affects immediately the power measurement in the adjustment circuits of the combiner filters of the other radio transmitters, thus causing adjustment error.

Finnish Patent Application 912 255 discloses an adjusting arrangement where the frequency selectivity of the measurement of the RF power passing through or reflected has been increased by mixing the RF measuring signal with a signal of the same frequency, i.e. a transmitting-frequency signal, so that a substantially zero-frequency signal, i.e. a DC signal, is obtained, which has a level proportional to the RF power reflected from the input or to the RF power passing through the filter. Power components leaking from the transmitting frequencies of other radio transmitters appear in the mixing result e.g. at a frequency of 300 kHz or at higher frequencies, which are filtered off in the lowpass filtration following the mixing. In this way the invention provides a measuring signal the level of which depends merely on the transmitting-frequency RF power component to be measured, whereas the measuring signal is not affected by the transmitting signals of other radio transmitters.

In all the prior art automatically tunable combiner filters, the measurements required for the tuning process have been performed by dedicated measuring and controlling electronics for each channel.

SUMMARY OF THE INVENTION

One object of the invention is a device by means of which a plurality of combiner filters are tuned jointly.

This is achieved by a device of the type described in foregoing Background section, which according to the invention is characterized in that said receiving means comprise at least two first inputs for the first sample signals of at least two different combiner filters;

a first selector means for connecting the desired first input selectively to the first detector means; at least two second inputs for the second sample signals of at least two different combiner filters; a second selector means for connecting the desired second sample signal selectively to the second detector means.

In the present invention the measuring signals of a number of different combiner filters are multiplexed to the same detector means. Multiplexing simplifies considerably the measuring and adjusting electronics of the tuning and adjusting means of combiner filters, especially with a high number of combiner filters. Other advantages include the more advantageous price, a smaller requirement of service and smaller size and lower weight.

In the preferred embodiment of the invention the multiplexing of measuring signals is used primarily to select the sample signals of the forward and reflected power of one and the same combiner filter to be tuned for the measuring electronics. One advantage of the multiplexing structure according to the invention is, however, that the controls of the first and the second selector means are independent of each other, which also allows isolation measurement between different channels. The sample signal of the forward power of one combiner filter and the sample signal of the reflected power of another combiner filter are thereby connected to the measuring electronics. When both sample signals undergo frequency-selective detection at the same frequency, the degree of isolation between the radio channels will be determined.

The invention thus also relates to a method for performing isolation measurement on radio transmitters isolated by combiner filters. The method is characterized in that it comprises the steps of:

detecting frequency-selectively the power of a forward RF signal with a first frequency passing to an input in a first combiner filter tuned to the first frequency;

detecting frequency-selectively the power of an RF signal component with a second frequency leaked from an output in a second combiner filter tuned to the second frequency to an input thereof;

determining the proportion of the power leaked from the forward power to another transmitter.

BRIEF DESCRIPTION OF THE DRAWINGS

In the following the invention will be described by means of illustrating embodiments with reference to the attached drawings, in which.

DETAILED DESCRIPTION

Figure 1:
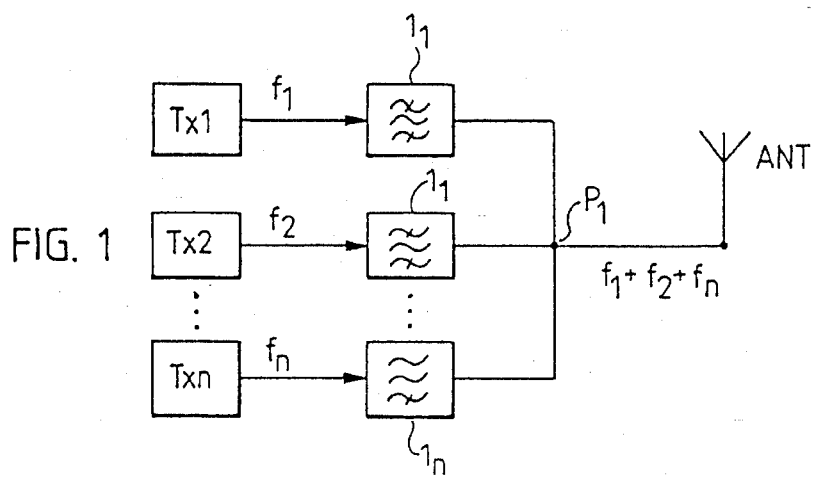
FIG. 1 is a block diagram illustrating a typical transmitter system implemented by combiner filters.

Referring to FIG. 1, n radio transmitters Tx1 ... Txn having transmitting frequencies $f_1 \ldots f_n$, respectively, are connected through bandpass filters $1_1, 1_2, \ldots 1_n$ tuned to the respective frequencies to a common summing point P1 and further through an antenna line to a common transmitting antenna ANT. So a radio-frequency (RF) signal applied to the transmitting antenna ANT comprises the frequencies $f_1 \ldots f_n$ of all the transmitters. The transmitting frequencies $f_1 \ldots f_n$ are within the range 920–960 MHz, for instance. Such bandpass filters connecting several transmitters to a common antenna are generally referred to as combiner filters. The combiner filter allows the transmitting signal of its own transmitter to pass to the antenna line with losses as small as possible, while it at the same time prevents efficiently the entrance of the transmitting signals of different frequencies from other transmitters to its own transmitter. The invention will be described below in connection with combiner filters, in which it can be particularly advantageously applied, but the invention can also be applied in filters intended for other purposes when frequency selective power measurement is required in the frequency adjustment.

Figure 2:
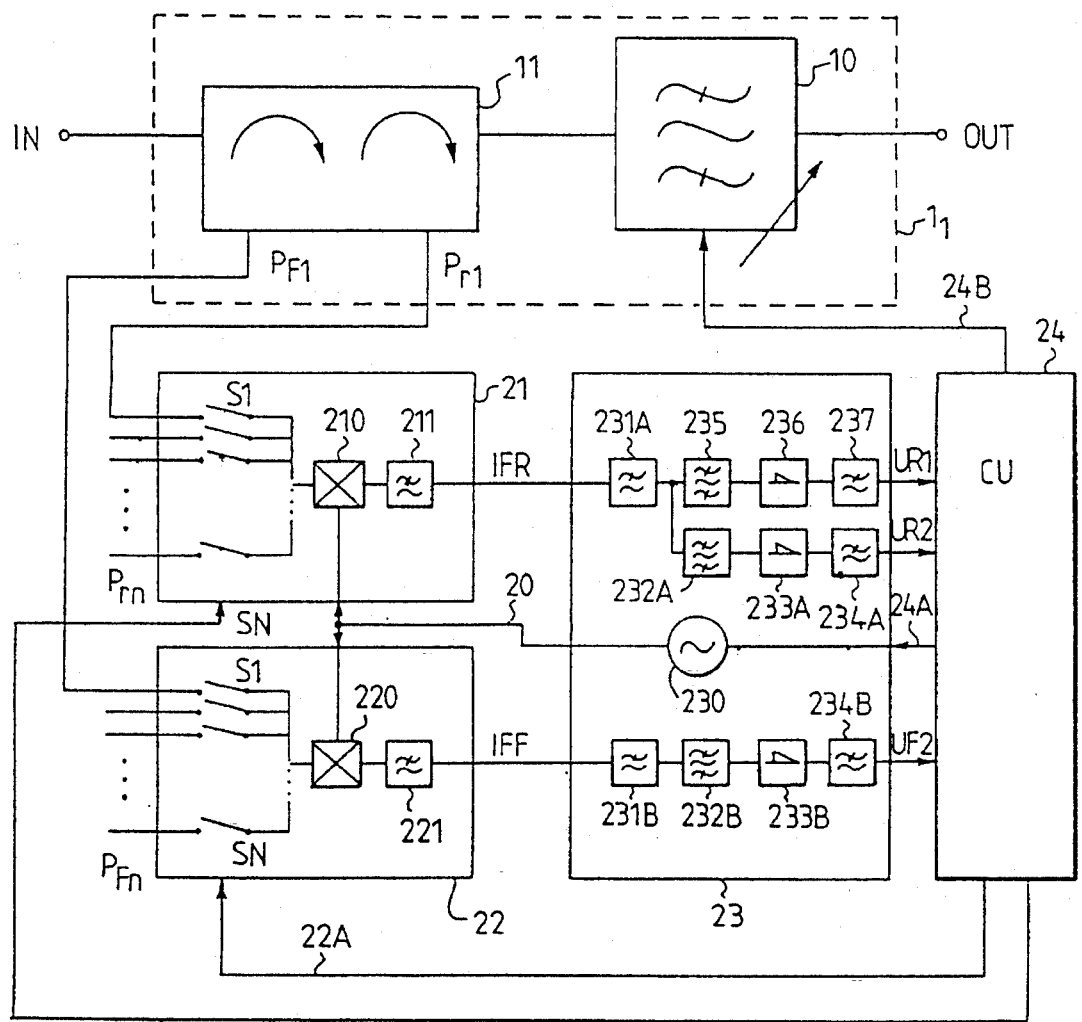
FIG. 2 is a block diagram of a switching arrangement according to the invention for adjusting a bandpass filter, in which power reflected from a filter input is measured.

FIG. 2 showing an arrangement according to the invention for adjusting combiner filters will now be referred to. As functional blocks, the arrangement comprises combiner blocks $1_1, 1_2 \ldots, 1_n$, of which only block $1_1$, selection blocks 21 and 22, detection block 23, and control block 24 are shown for the sake of clarity. The tuning of the combiner filter is based on the measurement of a radio-frequency transmitting signal to determine the forward power Pf passing to an individual combiner filter and the power Pr reflected from the filter. The power of the forward signal to the combiner filter and that of the signal reflected from the combiner filter are compared with each other, and the centre frequency of the filter is adjusted such that the proportion of the power reflected from the filter to the transmitter power is at minimum. The proportion of the power transmitted to the antenna is thus as large as possible. The tuning of the combiner filter is performed by a stepper motor adjuster, which is programmed to be controlled by the control unit 24 in response to the measuring signal data concerning the forward and reflected power.

Each combiner block $1_1, 1_2, \ldots, 1_n$ contains a combiner filter 10 adjusted by a stepper motor. After the filters 10 the transmitter lines are summed electrically by transmission lines of a predetermined length and applied to the antenna line. All transmitter branches comprise circulator means 11 between the transmitters and the combiner filters 10 so as to reduce the connecting of the transmitters from the antenna line to other transmitters. The circulator means 11 also derive radio-frequency samples required for the adjusting procedure from the forward power passing to the combiner filter (sample signals Pf1 ... Pfn) and from the power reflected from it (sample signals Pr1 ... Prn).

According to the invention, the combiner filter blocks have a common adjusting equipment by means of which the combiner blocks are tuned one by one. Therefore the radio-frequency measuring signals Pf1 ... Pfn and Pr1 ... Prn from the circulator means 11 of the combiner blocks have to be selected for further processing. Selections are made in the selection block 22 for the forward power Pf and in the selection block 21 for the reflected power Pr. In the selection block 22 the signal of the combiner filter to be tuned next is selected by switches S1–Sn on the basis of control provided over the four-line control bus 22A of the control unit 24. Correspondingly, in the selection block 21, the signal Pr of the combiner filter to be tuned next is selected by switches S1–Sn (e.g. RF relays) on the basis of control provided over the four-line control bus 21A from the control unit 24. The selected signals Pf and Pr are applied to mixers 220 and 210, respectively, by means of which the radio-frequency signals to be measured are mixed to a zero intermediate frequency. Local oscillator signals LO needed in the mixing are obtained from a synthesizer 230 provided in the detection block 23 and operating at the centre frequency of the transmitter channel to be tuned next. The synthesizer 230 obtains its channel control data from the control block via a bus 24A. The mixing forms the RF input signals Pf and Pr into zero-intermediate-frequency measuring signals IFF and IFR, in which the spectral components caused by the channel to be measured are at a frequency below 150 kHz and the levels of which are proportional to the levels of the radio-frequency signals Pf and Pr to be measured. As the levels of the low-frequency IF measuring signals caused by the channel to be measured are proportional to the radio-frequency powers of the combiner, the mixing allows frequency-selective power measurement. The low-frequency spectral components caused by the transmitting signals of other transmitters connected to the combiner system occur at frequencies above 500 kHz, and they can be filtered off by means of a lowpass filter 211 and 221 provided at the output of each selection block, respectively. The filtered intermediate-frequency signals IFR and IFF are applied to the detection block 23.

The function of the detection block 23 is to detect the magnitude of the forward power to the combiner filter to be tuned next and that of the power reflected from the combiner filter from the inter- mediate-frequency signals IFF and IFR obtained from selector blocks 21,22. The detection block 23 may have a structure such as shown in FIG. 2, for instance, where the forward power measuring branch from the input IFF to the output UF2 and the reflected power measuring branch from the input IFR to the output UR2 are mutually identical in signal processing. These measuring branches are used for the continuous fine-adjustment of the combiner filter. The measuring branch of the detection block from the input IRF to the output UR1 is used when the combiner is taken into use, whereby the output signal of the transmitter is a test signal with a transmission of equal power in each time slot.

The output signals UF2, UR1 and UR2 from the detection block 23 are applied to the control block 24, where the A/D conversion is performed and the tuning state of the combiner to be adjusted next is calculated from the output signals. The control unit 24 has a dedicated control output provided on respective line 24B for each combiner filter 10 for Controlling the stepper motor.

The structure and adjusting means of the detection block 23 are described in greater detail in PCT international application No. PCT/FI93/00564, entitled "Method and arrangement or tuning a-combiner filter", which is hereby incorporated by reference.

The function of the detection block 23 is to detect the magnitude of the forward power to the combiner filter to be tuned next and that of the power reflected from the combiner filter from the intermediate-frequency signals IFF and IFR obtained from selector cards. The forward power measuring branch from the input IFF to the output UF2 and the reflected power measuring branch from the input IFR to the output UR2 are mutually identical in signal processing. These measuring branches are used for the continuous fine-adjustment of the combiner filter. The inputs IFR and IFF of the measuring branches comprise lowpass filters 231A and 231B (threshold frequency e.g. 130 kHz), by means of which the mixing results of other transmitters are cut off. Bandpass filters 232A and 232B (bandwidth e.g 0.5 to 30 kHz) weight the spectrum of the signals to be measured in a manner such that the effect of signal components at the centre frequencies of the transmitting channel will be emphasized in the measuring result. In this way the inherent tendency of the mixing and measuring method to tune the combiner filter in accordance with the spectral distribution of the transmitter signal is prevented, and a good tuning accuracy is ensured. A detector 233A and 233B provided after the filter 232A and 232B, respectively, is a peak value rectifier, preferably a two-sided peak value rectifier. Two-sided peak value rectification is needed as the preceding lowpass filter causes fluctuation in the signal amplitude, which would cause measuring problems after rectification. In a TDMA type transmission, for which the preferred embodiment of the invention is designed, the transmitter power may vary rapidly from one time slot to another (the time slot is 577 µs), so that the peak value rectification also allows the measuring dynamics to be broadened. For example, when the transmitter employs a single time slot, the measuring dynamics will be improved by about 18 dB when a slow A/D conversion is applied in the measurement taking place in the control block. After the rectifier 233A and 233B, a lowpass filter 234A and 234B (bandwidth e.g. 30 Hz), respectively, is provided to filter off any disadvantageous fluctuations remaining in the output signal after the rectification. The UF2 and UR2 signals obtained after filtering are DC signals and proportional to the peak value of the voltage of the transmitter signal passing to the combiner filter 10 and reflected from it.

The measuring branch of the detection block from the input IRF to the output UR1 is used when the combiner is taken into use, whereby the output signal of the transmitter is a test signal with a transmission of equal power in each time slot. As compared with the UR2 branch, the most significant differences are the broader bandwidth in the bandpass filter 235 before the detector 236, the use of full-wave rectification in the detector 236, and the broader bandwidth in the lowpass filter after the detector 236. The UR1 branch is designed for tuning the combiner rapidly and coarsely by utilizing a test signal, and it cannot be used for continuous adjustment. In the coarse-adjustment measuring branch the 150-kHz bandpass filter 235 at the input of the detection block 23 allows the passage of the entire power of the signal IFR to be measured to the full-wave rectifier 236. As the entire spectrum of the signal IFR is admitted to the rectifier 236, no signal fluctuation due to the shaping of the spectrum occurs at the rectifier output. The bandwidth of the filter 237 positioned after the rectifier is selected to be as broad as possible (e.g. 600 Hz) in order that the delay caused by the filter in the signal of the reflected power passing through it would be small so as to ensure rapid measuring. On the other hand, the bandwidth has to be sufficiently narrow in order that amplitude attenuations contained in the transmission at the boundaries between the time slots would not cause fluctuation at the output of the measuring line. The above-mentioned attenuation points cause spectral components at frequencies multiples of about 1,730 Hz to occur in the signal.

In the preferred embodiment of the invention the multiplexing of measuring signals is used primarily to select the sample signals of the forward and reflected power of one and the same-combiner filter to be tuned for the measuring electronics. One advantage of the multiplexing structure according to the invention is, however, that the controls of the first and the second selector means are independent of each other, which also allows isolation measuring between different channels. In such a case the sample signal of the forward power of one combiner filter and the sample signal of the reflected power of another combiner filter are connected to the measuring electronics. When both sample signals undergo frequency-selective detection at the same frequency, the degree of isolation between the radio channels will be determined.

For a better understanding of the principle of isolation measuring, $f_1$-frequency leakages caused by the transmitter Tx1 (FIG. 1), having a radio channel at the frequency $f_1$, in the radio channels of the adjacent transmitters Tx2 . . . Txn will be explained. Even though the function of the combiner filter is to prevent or minimize the leakages of transmitting signals of different frequencies from other transmitters in the direction of the antenna ANT to its own transmitter, no efficient isolation is obtained between the transmitters Tx1 . . . Txn with small channel spacings. For instance, in the transmitter Tx2, which is here assumed to have the frequency $f_2$ in the frequency range of the radio system, being closest to the frequency $f_1$ of the transmitter Tx1, the combiner filter $1_2$ has a finite suppression on the stop band. As a result, a portion of the transmitting signal of the transmitter Tx1 is able to pass through the combiner filter 10 of the transmitter Tx2 in the direction of the transmitter Tx2 to a circulator means functioning as an isolator 11. This "reflected" signal can be measured in a manner similar to the measuring of the Tx2 transmitting signal portion reflected from the combiner filter 10 in tuning measurement.

Isolation measuring according to the invention takes place by a measuring circuitry shown in FIG. 2 in the following way. On measuring the isolation of e.g. the transmitter Tx1 from other channels, the synthesizer 230 is commanded to the channel $f_1$ of the transmitter Tx1, and the forward power selection block 22 selects a sample signal $P_{f1}$ of the forward power of the transmitter Tx1 for down-conversion by the mixer 20. The reflected power selection block 21 selects a sample signal $P_r$ of the reflected power of an adjacent transmitter under examination, e.g. Tx2, for down-conversion by the mixer 210. Down-conversion makes the measuring process frequency-selective, that is, the signal of the channel $f_1$ can be extracted from both of the selected sample signals for detection. The detection block 23 forms detection results UR2 and UF2, respectively, from which, after the A/D conversion, the control block 24 calculates the proportion of the power leaked from the transmitter Tx1 in the direction of the transmitter under examination, e.g. Tx2.

The switches S1–Sn of the selection blocks 21 and 22 can be realized e.g. by using RF relays as switches or by using switches and transmission lines of a predetermined length. A problem with relay selections, however, is the large mechanical size and high price. Multiplexing switching arrangements containing transmission lines of a predetermined length (in practice, electrically multiples of a quarter wave), in turn, are large in size when made from conventional printed circuit board materials.

Figure 3:
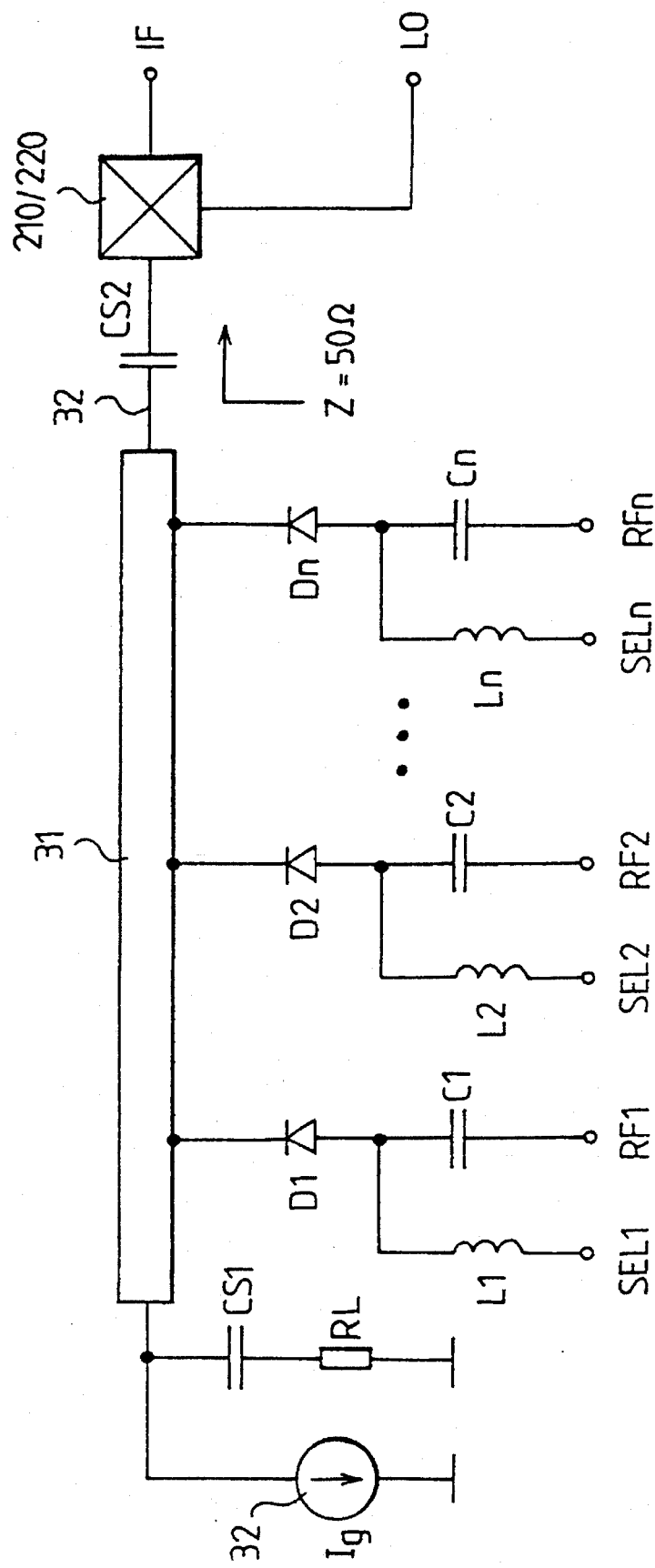
FIG. 3 is a more detailed switching diagram of the selection blocks 21 and 22 of FIG. 2.

In the preferred embodiment of the invention, the selection blocks 21 and 22 are realized by a circuit shown in FIG. 3, comprising RF signal inputs RF1 . . . RFN for the sample signals $P_{f1} \ldots P_{fn}$ or $P_{r1} \ldots P_{rm}$, respectively. Each input RF1 . . . RFN is connected by a respective diode switch D1 . . . Dn to a summing transmission line 31 operating as a radio-frequency switching and transmission means connected to the output 32 of the selection circuit. One switch diode D1 . . . Dn at a time is caused to conduct so that the selected diode allows the passage of the signal to be measured from the selected input to the summing transmission line 31. On the transmission line 31 the signal is divided into two portions equal in size, which start to propagate to the opposite ends of the transmission line 31. Both ends of the transmission line exhibit a load corresponding with the specific impedance of the transmission line (e.g. 50 Ohm), so that no significant amount of power is reflected from the end of the transmission line.

Those of the diodes D1...Dn which are not switched to conduct appear in the direction of the transmission line as low capacitances. In narrowband applications, e.g. when the frequency band employed is of the order of a few percent of the centre frequency, the stray capacitance of this particular diode can be compensated by an LC circuit (not shown) connected in parallel with the diode. An alternative way to compensate for the stray capacitance is to use the diode switches D1...Dn to form part of the capacitive portion of the transmission line 31, in which case the stray capacitance can be compensated by the layout design of the printed circuit board. This way, however, requires that the diode switches D1...Dn can be positioned with small spacings as compared with the wave length of the sample signal to be switched.

The control of the switch diodes D1...Dn is realized by DC or DC voltage generators (not shown), which apply a forward current control to control inputs SEL1 . . . SELn for opening the switch diode D1 . . . Dn or a reverse voltage control for closing the switch diode D1 . . . Dn. The controls SEL are connected via coils L1...Ln so that the coil feeding at the frequency of the sample signal to be connected will not load the transmission line. Correspondingly, the switching current applied to the transmission line 31 through the switch diode has to be transferred away from the transmission line 31 without loading it. Capacitors C1 . . . Cn and Cs1 and Cs2 are coupling capacitors.

The figures and the description related to them are only intended to illustrate the present invention. In their details the device and method according to the invention may vary within the scope and spirit of the attached claims.

We claim:

1. Device for adjusting a combiner filter, comprising means for receiving a first sample signal (Pf) proportional to forward RF power to the combiner filer (10) and a second sample signal (Pr) proportional to RF power reflected from the combiner filter;

first frequency-selective detector means (220, 233B) for detecting the magnitude of the forward power by means of said first sample signal (Pf);

a second frequency-selective detector means (210, 233A) for detecting the magnitude of the reflected power by means of said second sample signal (Pr);

a control means (24) for adjusting the centre frequency of the combiner filter in response to the detection results of the detector means;

characterized in that said receiving means comprise at least two first inputs for the first sample signals (Pf) of at least two different combiner filters;

a first selector means (22) for connecting the desired one of the first sample signals (Pf) selectively to the first detector means (220, 233B);

at least two second inputs for the second sample signals (Pr) of at least two different combiner filters;

a second selector means (21) for connecting the desired one of the second sample signals (Pr) selectively to the second detector means (210, 233A).

2. Device according to claim 1, characterized in that the selector means (21, 22) are responsive to the control means (24) for alternately selecting the pairs of the first and the second sample signals of the combiner filters.

3. Device according to claim 1, characterized in that the controls of the first and the second selector means (21, 22) are independent of each other.

4. Device according to claim 3, characterized in that the device has a measuring state in which the first selector means (21) selects the first sample signal of the combiner filter to be tuned and the second selector means (22) selects the second sample signal of the combiner filter to be tuned for detection and calculation of a reflection coefficient.

5. Device according to claim 1, characterized in that the device has an interference measuring state in which the first selector means (21) selects the first sample signal of the combiner filter to be tuned and the second selector means (22) selects the second signal of another combiner filter.

6. Device according to claim 1, characterized in that the first and the second frequency-selective detector means both comprise mixing means (210, 220) for down-conversion of the RF sample signals before detection.

7. Device according to claim 1, characterized in that both of the selector means comprise at least two RF inputs (RF1-RFn) and one RF output (32);

a summing transmission line (31) connected to the output (32) of the selector means;

a switching diode (D1-Dn) connected between the summing transmission line (31) and each RF input;

means for controlling the switching diodes one at a time selectively so as to cause them to conduct for switching the RF signals from the RF inputs to the summing transmission line.

* * * * *